United States Patent [19]

Hawkins et al.

[11] Patent Number: 5,047,128

[45] Date of Patent: Sep. 10, 1991

[54] ELECTRODIALYSIS CELL FOR REMOVAL OF EXCESS ELECTROLYTES FORMED DURING ELECTRODEPOSITION OF PHOTORESISTS COATINGS

[75] Inventors: Robert E. Hawkins, Northboro; Richard L. Harrison, Milford, both of Mass.

[73] Assignee: Shipley Company Inc., Newton, Mass.

[21] Appl. No.: 459,535

[22] Filed: Jan. 2, 1990

[51] Int. Cl.$^5$ ............................ B01K 5/02; B01D 13/02
[52] U.S. Cl. ................................ 204/180.8; 204/180.6; 204/182.4; 204/299 EC; 204/301; 204/DIG. 13
[58] Field of Search ............. 204/182.4, 180.8, 299 R, 204/299 EC, DIG. 13, 182.3, 301, 180.6

[56] References Cited

U.S. PATENT DOCUMENTS

| | | | |
|---|---|---|---|
| 3,304,250 | 2/1967 | Gilchrist | 204/180.8 |
| 3,671,412 | 6/1972 | Lohr | 204/180.8 |
| 3,865,706 | 2/1975 | Cooke | 204/180.8 |
| 3,973,987 | 8/1976 | Hewitt et al. | 204/238 |
| 4,284,493 | 8/1981 | Case et al. | 204/299 EC |
| 4,592,816 | 6/1986 | Emmons et al. | 204/180.6 |
| 4,775,478 | 10/1988 | Voss et al. | 210/638 |
| 4,839,253 | 6/1989 | Demmer et al. | 204/181.7 |

FOREIGN PATENT DOCUMENTS 0560013 5/1977 U.S.S.R. .
2111080 11/1982 United Kingdom .

Primary Examiner—John F. Niebling
Assistant Examiner—Arun S. Phasge
Attorney, Agent, or Firm—Robert L. Goldberg

[57] ABSTRACT

This invention provides a means of controlling the composition of electrodepositable photoresists emulsion. The system removes contaminants from the bath which may adversely effect the quality of the deposited coatings and allows for continuous monitoring of the conductivity of the system.

22 Claims, 1 Drawing Sheet

ELECTRODIALYSIS CELL FOR REMOVAL OF EXCESS ELECTROLYTES FORMED DURING ELECTRODEPOSITION OF PHOTORESISTS COATINGS

BACKGROUND OF THE INVENTION

1. Introduction

This invention relates to an improved method of electrodepositing photosensitive materials in which the coating bath contains an electrodialysis cell as a means of controlling the composition of the bath. In particular, the system provides a means of removing undesirable components from a photoresists formulation bath while allowing continuous monitoring of the conductivity of the system.

2. Discussion of Prior Art

Electrocoating is a term commonly used in the automotive industry for the combined process of electrolytic and electrophoretic deposition of paints onto conductive parts. The electrocoating paint bath usually contains a resin system, a cross-linker, pigments, solvents, additives and a solubilizing agent to render the other ingredients water soluble or dispersible. In anodic electrocoating systems, the solubilizer is a base and in the cathodic process it is an acid. In order to coat articles, an electric current is applied to a bath to cause the particles to migrate towards the electrode of opposite charge. In the anodic system, the solubilizer migrates to the cathode, and the charged colloidal particles migrate to the anode. The cathodic process is the opposite. The cathode becomes the workpiece or coated object. Under an applied voltage, the solubilizer, usually an organic acid, migrates to the anode, which is constructed of an inert material. The solubilizer reacts with hydrogen ions generated from the electrolysis of water to form the free acid. The acid may be used for solubilizing the incoming replenishment, or it can be flushed out of the system. At the cathode, the electrolysis of water forms an alkaline boundary layer which neutralizes and coagulates the incoming colloidal resin particles depositing them as a water-insoluble film.

The composition of the paint bath differs from the composition of the deposited film because various components of the bath migrate at different rates. If this is not accounted for in the replenishment formula, a change in bath composition will occur. If the solubilizer content is allowed to increase in the bath, poor film quality and possible resolubilization of the deposited film can occur. Conversely, if the solubilizer content is allowed to drop, insolubility of the bath can occur. Therefore, it is desirable to incorporate some means of controlling the solubilizing agent.

Common methods used to control the solubilizer content include electrodialysis and ultrafiltration. Electrodialysis utilizes a semi-permeable membrane box fitted around the tank electrode. The box captures free solubilizer during the coating process and removes it from the system usually by flushing it to drain. This procedure allows the addition of a completely solubilized and water-soluble system as replenishment material. Major problems with this approach are the very high cost of installation, maintenance of the membrane box or boxes, waste of solubilizer and water pollution. Ultrafiltration is used to make minor adjustments in the solubilizer content. Complete control of the solubilizer is rarely attempted with this method, due to the need for extremely large volumes of makeup deionized water.

The ultrafiltration process utilizes a semi-permeable membrane which readily allows small molecules such as water, solvent, solubilizer and ionic salts to pass through while retaining the larger paint particles or micelles. Liquid passing through is called permeate. By using a closed-loop ultrafiltration system, the permeate generated during the filtration process can be used to rinse the coated articles and recover dragged-out paint from the film. The permeate could then be returned to the bath with the paint particles. This system solved the problem of wasted paint particles and provided a means of controlling the tank for excess conductivity.

U.S. Pat. No. 3,304,250 discloses a process utilizing electrodialysis to control the bath composition in an electrocoating process. In the practice of the invention, a dialysis membrane, which is permeable to water and water soluble resin dispersal agents, is placed in the bath between the article to be coated and the tank electrode. The membrane is impermeable to the resin and therefore creates a coating zone which contains the resin dispersion and a zone which is free of resin and contains the water soluble resin dispersant, thereby providing a means for controlling the level of dispersant in the bath. Replenishment solutions may then be added to the coating zone to control the composition.

Although electrodialysis within the bath provides excellent control of solubilizer, it is very expensive and inconvenient. It is often necessary to use more than one electrodialysis unit in the bath and the membranes are susceptible to damage by the articles being coated. The membranes may also become clogged with paint rendering them inactive.

U.S. Pat. No. 4,775,478 discloses a process for removing acid from cathodic electrocoating baths. The patent discloses a means of controlling the bath composition by removing a portion of the bath and subjecting it to ultrafiltration. The solution to be ultrafiltered is brought, under pressure, into contact with a filtration membrane arranged on a porous carrier in a cell. The contents of the ultrafiltration cell are stirred in order to prevent accumulation of the retained material on the membrane surface. Ultrafiltrate is formed continuously and is collected until the retained solution in the cell has reached the desired concentration. Part or all of the ultrafiltrate is then fed into an exchange cell along with an aqueous solution of a base to remove excess acid by dialysis. The dialysis process is carried out without the use of an electrical field.

Great Britain Patent No. 2 111 080 discloses a similar process for treatment of an electrodeposition bath combining ultrafiltration and electrodialysis. The ultrafiltration process is the same as described above but the next step subjects the ultrafiltrate to electrodialysis. The process involves use of an electromotive force to accelerate dialysis. A portion of the ultrafiltrate is passed to the electrodialysis unit where the solubilizer and undesirable contaminants are forced through a semi-permeable membrane and expelled from the system. The ultrafiltrate which has been subjected to electrodialysis is then returned to the electrodeposition tank or may be used first to rinse coated articles prior to return to the tank.

All of the above procedures pertain to electrocoating which is a term of art used in the automotive industry. The photoresists industry has begun using a similar process called electrodeposition which refers to depositing photoresists coatings onto conductive substrates under an applied voltage. The process is useful in the manufacture of electronic devices such as printed circuit boards. Photoresists coatings are deposited so that they readily adhere to the substrate as a continuous film, yet unlike paint coatings, they must be easily removed from the substrate during subsequent processing steps. Thus, control of the bath composition is critical to the quality of the final product obtained.

In the electrodeposition of photoresists coatings, several factors effect the quality of the deposited film. These factors include temperature, applied voltage, and conductivity of the bath. Without a means of controlling and monitoring the bath composition, the photoresists coating may display poor film quality and poor adhesion to the substrate. Bath stability would also be negatively effected if process conditions are not controlled.

Photoresists may be deposited on conductive substrates both cathodically and anodically. In the process of cathodic electrodeposition of photoresists, the positively charged micelles of the photoresists migrate to the conductive substrate where they are deposited as a uniform film. The negatively charged counter-ion migrates to the electrode of opposite charge where it is neutralized back to acid by the hydrolysis of water. Without some means of removing it, the acid concentration will continue to build up in the photoresists bath increasing conductivity of the bath and causing the emulsified photoresists formulation to degrade. The buildup of this counter-ion also contributes to loss of the ability to control the film thickness and in the deposited film being badly pin-holed. Both of these defects account for failures in the performance of the printed circuit board.

If the acid is isolated into a confined area with the anode the conductivity of the system must be monitored to prevent corrosion of the anode. Monitoring of the conductivity of the system may be done by placing a conductivity probe into the isolated area containing the acid which has been removed, by some means, from the emulsion. Typically, the conductivity is measured by placing a conductivity probe into the isolated area and adjustments are made to the system as needed.

SUMMARY OF THE INVENTION

This invention describes a method of effectively controlling the buildup of excess counter-ion formed in photosensitive baths during an electrodeposition process and a method of continuously monitoring the process system by a measure of conductivity.

More specifically, this invention describes a system for use in an electrodeposition bath containing a formulation for photoresists coatings. The system prevents buildup of acid, in a cathodic process, which would adversely effect the film coating quality and efficiency of the bath performance. The system used employs an anolyte box placed inside the bath. The anolyte box is an enclosure around an electrode with at least one side of the box being an ion-selective membrane. During the electrodeposition process, the counter-ion migrates through the membrane under an electric field and into the box. When the counter-ion approaches the electrode, it is neutralized to acid and remains within the box, a process which effectively removes the neutralized material from the electrodeposition photoresists bath.

A typical anolyte system would consist of a tank, located exterior to the coating bath, that contains water and the neutralized counter-ion. The fluid in the anolyte tank is pumped to an anolyte box located in the coating bath and serves to buffer heat and acid concentration. Concentration of acid is monitored by a conductivity probe placed in-line in the system, thus eliminating the need for sampling the anolyte and measuring conductivity outside of the system. The in-line conductivity probe also provides greater sensitivity and permits both closer and continuous control of the conductivity. When an upper conductivity level is reached, distilled or deionized water may be added to the tank to adjust the conductivity. A water is added to lower the conductivity, the excess contents of the anolyte tank are directed to an overflow drain until a preset lower conductivity level is reached. Once the conductivity has been lowered, the water supply is turned off and the system again operates as a closed system within a desired conductivity range.

The same type system may be used in an anodic electrodeposition process to remove excess base from the photoresists bath composition.

DESCRIPTION OF THE PREFERRED EMBODIMENTS

Figure 1:
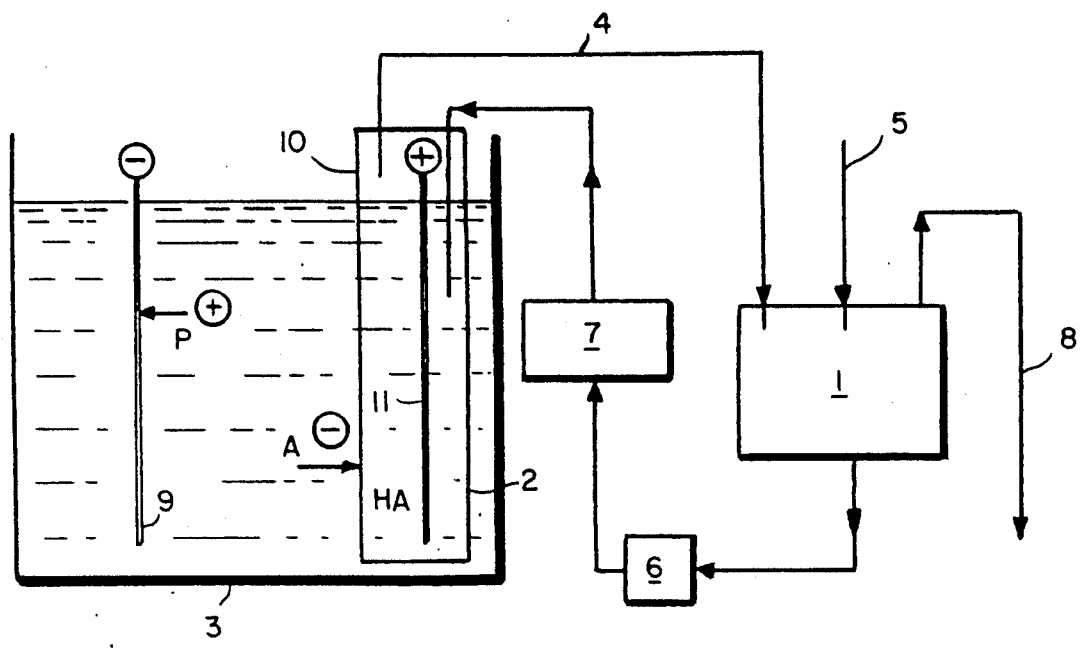

Electrodeposition involves the motion of charged particles through a liquid medium under the influence of an applied electrical field. The process is conducted in a bath with the conductive substrate serving as one electrode. Charged micelles in the liquid medium are thus electrodeposited on an oppositely charged electrode.

Electrodeposition of photoresists coatings is well know in the art. A typical electrodepositable photoresists bath composition is described in U.S. Pat. No. 4,592,816, incorporated herein by reference. The composition of the photosensitive polymer is such that it has a carrier group or groups that become positively or negatively charged upon reaction with an acid or base, respectively. Suitable polymers are addition or condensation polymers having carrier groups. Addition polymers having carrier groups prepared from monomers having ethylenic unsaturation are preferred. Useful polymers include acrylic polymers, vinyl polymers other than acrylic polymers, epoxy polymers, polyurethanes, polyesters and polyamides. Positively charged carrier groups include quaternary ammonium groups, sulfonium groups and sulfoxonium groups. Other groups which become positively charged upon reaction with an acid, such as amine groups, may also be employed. Acids that ar useful for protonation of the carrier groups of the polymers include lactic acid, glycolic acid, hydroxyacetic acid, hydrochloric acid, formic acid, acetic acid and phosphoric acid. An example of a typical photoresists formulation for use with the practice of this invention is given in Table 1.

TABLE 1

| Ingredient | Relative Concentration |
| --- | --- |
| Polymer | 100 |
| Solvent | 0–70 |
| Unsaturated Monomer | 30–50 |
| Photoinitiator | 3–8 |
| Acid | 1–3 |
| Water | 900–2600 |

The following description is to be used as an example of how the composition of the polymer would allow the disclosed invention to operate and should not be taken as a limitation to the scope of the invention. An acrylic polymer bearing cataphoretic carrier groups can be prepared by the polymerization of monomers, one of which has a basic amine group, such as 2-dimethylamino ethyl methacrylate (DMAEMA). Upon the addition of an acid, such as lactic acid, the amine groups on the polymer are converted to positively charged ammonium salts. The positively charged micelles then migrate under an electric current to the cathode (article to be coated) while the counter-ion (lactate ion) migrates to the anode. With the continuous electrolysis of water also occurring, the lactate ion is neutralized back to lactic acid.

The anolyte box, which is placed in the coating bath, serves as the anode and effectively traps excess lactic acid. The term "box" refers to an enclosure not necessarily the shape of the enclosure. The shape of the anolyte box may be square, rectangular or cylindrical. A typical rectangular anolyte box used in the paint industry is described in U.S. Pat. No. 4,284,493 and a typical cylindrical anode cell used in the paint industry is described in Japan Patent No. 57-27955, both incorporated herein by reference.

A supplier of typical rectangular electrodialysis cells is Arelco Manufacturing. The unit consist of two essential components, a membrane and an anode. The membrane, consisting of a permeable material, may be coated with a resin in order to make it an ion-selective membrane. Suitable ion-selective membranes are available from Sybron Chemicals, Inc. as either anionic or cationic selective membranes. The membrane permits passage of excess counter-ions into the anolyte box and prevents passage of the polymer particles into the box. The anode is constructed of an inert material such as carbon, titanium or stainless steel and is capable of handling an electrical current of 150 amperes at a potential of 400 volts D.C. The anolyte box incorporates a protective and non-clogging grill which allows maximum use of membrane area. The anolyte box is also equipped with an internal cell chamber to allow for flushing of the unit and replacement with fresh anolyte.

The use of a cylindrical design anode cell offers several advantages over a rectangular anode box. The cell has a tubular membrane shell which can be easily replaced and does not require an exterior grid to provide support. The cylindrical shape also provides more membrane area per unit of anode area. The design is also such that the cell can be modified to be completely immersible and can be located in any position desired relative to the cathode.

In the operation of the present invention, FIG. 1 shows a typical schematic diagram of the use of an anolyte box and anolyte system during cathodic electrodeposition of photoresists material. Fresh anolyte is stored exterior to the system in an anolyte tank (1). The anolyte box (2) is located in the electrodeposition tank (3) away from any metallic surface which might act as a path for electrical current to ground. In the alternative, any adjacent metal or metal coated surface must be insulated by a non-conductive material. The anolyte discharge or overflow (4) is located above the top of the bath to avoid inclusion of photoresists formulation into the anolyte system and to allow for gravity flow of excess anolyte from the box to the anolyte tank. The overflow is fed directly to the anolyte tank where it may be mixed with distilled or deionized water (5) when necessary to lower the conductivity of the bath. The contents of the anolyte tank may be returned to the anolyte box by means of a circulation pump (6). The circulation pump feeds fresh anolyte through a conductivity probe (7) prior to return to the anolyte box. The use of an in-line conductivity probe allows for monitoring of the conductivity of the bath on a continuous basis and allows the operator to adjust the conductivity at the anolyte tank by allowing excess anolyte to drain (8) from the system and adding distilled water to the tank until a preset lower conductivity level is reached.

During the electrodeposition process, the positive micelles (P) of the coating formulation bath are deposited on the cathode or article to coated (9); while the negative counter-ion, lactate (A), moves through the membrane surface (10) of the anolyte box towards the anode (11) where it is neutralized to lactic acid (HA) and is effectively removed from the electrodeposition bath. This closed system provides for continual removal of generated acid from the electrodepositable photoresists bath thereby improving the quality of the film deposited on the substrate.

An example of an electrodepositable photoresists composition which would work in an anodic process is disclosed in U.S. Pat. No. 4,839,253, incorporated herein by reference. In an anodic process, the work piece would be negatively charged and the electrode in the electrodialysis cell would have a positive charge. Instead of using acids to protonate the carrier groups, bases are used to convert the resins into soluble salts. Suitable bases include inorganic bases such as sodium or potassium hydroxide or carbonate and ammonia, and organic bases such as triethylamine, triethanolamine, benzyldimethylamine, dimethylethanolamine, dimethylaminomethylpropanol and morpholine. The electrodialysis cell would be constructed using a cationic membrane to facilitate removal of excess bases from the photoresists composition.

What is claimed is:

1. A method for controlling build-up of excess electrolyte in an electrodeposition bath containing a photoresist formulation while electrodepositing said photoresist on a substrate, said method comprising the steps of providing an electrodialysis cell within said bath to remove excess electrolyte; continuously circulating said electrolyte from said electrodialysis cell through an external tank containing electrolyte, through an in-line conductivity probe external to said bath, and back to said electrodialysis cell; and mixing said electrolyte with water in said external tank as necessary to lower conductivity in response to the reading from said in-line conductivity probe.

2. The method of claim 1 wherein said photoresists formulation contains a polymer, solvent, an unsaturated monomer, a photoinitiator, acid and water.

3. The method of claim 1 wherein said photoresists formulation contains a polymer, solvent, an unsaturated monomer, a photoinitiator, base and water.

4. The method of claim 1 wherein said electrodialysis cell is rectangular in shape.

5. The method of claim 1 wherein said electrodialysis cell is cylindrical in shape.

6. The method of claim 1 wherein said electrodialysis cell is fully immersible.

7. The method of claim 1 wherein said electrolyte is an acid.

8. The method of claim 1 wherein said electrolyte is a base.

9. The method of claim 7 wherein said acid is selected from the group comprising lactic acid, glycolic acid, hydroxyacetic acid, hydrochloric acid, formic acid, acetic acid or phosphoric acid.

10. The method of claim 8 wherein said base is selected from the group comprising sodium hydroxide, potassium hydroxide, sodium carbonate, potassium carbonate, ammonia, triethylamine, triethanolamine, benzyldimethylamine, dimethylethanolamine, dimethylaminomethylpropanol or morpholine.

11. An apparatus for controlling an electrodeposition bath containing a photoresists formulation comprising:
   a. an ion-selective membrane surrounding an electrode in said bath thereby defining a chamber in which excess electrolytes of said bath are isolated from the balance of said bath, said chamber being isolated from any path for electrical current to ground;
   b. a means for diverting overflowing electrolyte from inside said isolated chamber into an external tank;
   c. a means for adding diluent to said tank until a desired concentration of electrolyte solution is achieved;
   d. a means for draining excess volume created by adding said diluent;
   e. a means for returning said electrolyte solution to said isolated chamber; and
   f. a means for measuring the conductivity of said electrolyte solution.

12. The apparatus of claim 11 wherein said photoresists formulation contains a solvent, a polymer, an unsaturated monomer, a photoinitiator, an acid and water.

13. The apparatus of claim 11 wherein said photoresists formulation contains a solvent, a polymer, an unsaturated monomer, a photoinitiator, a base and water.

14. The apparatus of claim 11 wherein said utensil has a rectangular shape.

15. The apparatus of claim 11 wherein said utensil has a cylindrical shape.

16. The apparatus of claim 11 wherein said utensil is fully immersible.

17. The apparatus of claim 11 wherein said excess electrolyte is an acid.

18. The apparatus of claim 11 wherein said excess electrolyte is a base.

19. The apparatus of claim 11 wherein said excess electrolyte is selected from the group comprising lactic acid, glycolic acid, hydroxyacetic acid, formic acid, acetic acid or phosphoric acid.

20. The apparatus of claim 11 wherein said excess electrolyte is selected from the group comprising sodium hydroxide, potassium hydroxide, sodium carbonate, potassium carbonate, ammonia, triethylamine, triethanolamine, benzyldimethylamine, dimethylethanolamine, dimethylaminomethylpropanol or morpholine.

21. The apparatus of claim 11 wherein said diluent is water.

22. The apparatus of claim 11 wherein said means for measuring conductivity is an in-line conductivity probe.

* * * * *